US012658409B2

(12) United States Patent
Yamakado et al.

(10) Patent No.: US 12,658,409 B2
(45) Date of Patent: Jun. 16, 2026

(54) METHOD OF MANUFACTURING SEMICONDUCTOR DEVICE, SUBSTRATE PROCESSING METHOD, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventors: Yuki Yamakado, Toyama (JP); Masanori Nakayama, Toyama (JP); Katsunori Funaki, Toyama (JP); Tatsushi Ueda, Toyama (JP); Yasutoshi Tsubota, Toyama (JP); Yuichiro Takeshima, Toyama (JP); Hiroto Igawa, Toyama (JP); Eiko Takami, Toyama (JP); Keita Ichimura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 811 days.

(21) Appl. No.: 17/576,557

(22) Filed: Jan. 14, 2022

(65) Prior Publication Data

US 2022/0139675 A1      May 5, 2022

Related U.S. Application Data

(63) Continuation of application No. PCT/JP2020/032831, filed on Aug. 31, 2020.

(30) Foreign Application Priority Data

Sep. 12, 2019      (JP) ................................. 2019-166275

(51) Int. Cl.
*H01J 37/32* (2006.01)
*C23C 16/40* (2006.01)
*C23C 16/455* (2006.01)

(52) U.S. Cl.
CPC ...... *H01J 37/32458* (2013.01); *C23C 16/401* (2013.01); *C23C 16/402* (2013.01);
(Continued)

(58) Field of Classification Search
CPC ............ H01J 37/32458; H01J 37/3244; H01J 37/32816; C23C 16/45512
See application file for complete search history.

(56) References Cited

U.S. PATENT DOCUMENTS

2007/0218687 A1      9/2007   Sugawara et al.
2009/0252863 A1     10/2009   Yoshizawa
(Continued)

FOREIGN PATENT DOCUMENTS

JP      2004228355 A      8/2004
JP      2009158784 A      7/2009
(Continued)

OTHER PUBLICATIONS

ScienceDirect, Gas Plasma, https://www.sciencedirect.com/topics/engineering/gas-plasma.*
(Continued)

*Primary Examiner* — James M Mellott
(74) *Attorney, Agent, or Firm* — Edell, Shapiro & Finnan, LLC

(57) ABSTRACT

The present disclosure provides a method of manufacturing a semiconductor device, including: (a) loading a substrate with a film formed on a surface thereof into a process vessel; (b) generating a reactive species containing oxygen and a reactive species of a rare gas by converting a mixed gas containing the rare gas and an oxygen-containing gas into a
(Continued)

```
                    START
                      │
          WAFER LOADING STEP (STEP A)
                      │
          PRESSURE AND TEMPERATURE
              ADJUSTING STEP
                      │
 ┌─OXIDATION PROCESS ──────────────────┐
 │                    │                 │
 │   REACTIVE SPECIES GENERATING STEP   │
 │              (STEP B)                │
 │                    │                 │
 │      OXIDIZING STEP (STEP C)         │
 │                    │                 │
 └────────────────────────────────────┘
                      │
             AFTER-PURGE STEP
        AND RETURNING TO ATMOSPHERIC
               PRESSURE STEP
                      │
          WAFER UNLOADING STEP
                      │
                    END
``` plasma state; and (c) oxidizing the film by supplying the reactive species containing oxygen to the substrate together with the reactive species of the rare gas. In (b), a partial pressure ratio $P_N/P_T$, which is a ratio of a partial pressure $P_N$ of the rare gas in the process vessel to a total pressure $P_T$ of the mixed gas in the process vessel, is set to a value of 0.4 or less.

23 Claims, 5 Drawing Sheets

(52) U.S. Cl.
    CPC .. *C23C 16/45512* (2013.01); *C23C 16/45563* (2013.01); *H01J 37/3244* (2013.01); *H01J 37/32816* (2013.01)

(56)                References Cited

U.S. PATENT DOCUMENTS

| | | | |
|---|---|---|---|
| 2010/0105192 | A1 | 4/2010 | Akae et al. |
| 2013/0273748 | A1 | 10/2013 | Sasajima et al. |
| 2014/0106573 | A1 | 4/2014 | Terasaki et al. |
| 2019/0221427 | A1 | 7/2019 | Lo et al. |
| 2019/0355575 | A1 | 11/2019 | Takeshima et al. |

FOREIGN PATENT DOCUMENTS

| | | | | |
|---|---|---|---|---|
| JP | 2010-62576 | A | 3/2010 | |
| JP | 2010232240 | A | 10/2010 | |
| JP | 2014075579 | A | 4/2014 | |
| KR | 10-2009-0100811 | A | 9/2009 | |
| KR | 10-2010-0047821 | A | 5/2010 | |
| KR | 10-2013-0055691 | A | 5/2013 | |
| WO | 2007/010736 | A1 | 1/2009 | |
| WO | WO-2018179038 | A1 * | 10/2018 | .......... C23C 16/401 |

OTHER PUBLICATIONS

Notice of Reasons for Refusal and English translation in Japanese Application No. 2021-545221, issued Jul. 19, 2022, 12 pages.
Request for the Submission of an Opinion with English translation in Korean Application No. 10-2022-7000817, dated Nov. 20, 2023, 19 pages.

* cited by examiner

FIG. 1

WER [a.u.]

0    4    20        40        60              100

$O_2 + H_2$  ONLY                                    He  ONLY

PARTIAL PRESSURE RATIO $P_N/P_T$ [%]

| | SAMPLE #1 | SAMPLE #2 | SAMPLE #3 |
|---|---|---|---|
| He [slm] | 1 | 0.5 | 0 |
| $O_2$ [slm] | 0.75 | 1 | 1.25 |
| $H_2$ [slm] | 0.75 | 1 | 1.25 |

SAMPLE #1
PARTIAL PRESSURE
RATIO $P_N/P_T$ = 0.4

SAMPLE #2
PARTIAL PRESSURE
RATIO $P_N/P_T$ = 0.2

SAMPLE #3
PARTIAL PRESSURE
RATIO $P_N/P_T$ = 0

METHOD OF MANUFACTURING SEMICONDUCTOR DEVICE, SUBSTRATE PROCESSING METHOD, NON-TRANSITORY COMPUTER-READABLE RECORDING MEDIUM AND SUBSTRATE PROCESSING APPARATUS

CROSS REFERENCE TO RELATED APPLICATIONS

This non-provisional U.S. patent application is a continuation of International Application No. PCT/JP2020/032831, filed on Aug. 31, 2020, which claims priority under 35 U.S.C. § 119 to Application No. JP 2019-166275 filed on Sep. 12, 2019, the entire contents of which are hereby incorporated by reference.

TECHNICAL FIELD

The present disclosure relates to a method of manufacturing a semiconductor device, a substrate processing method, a non-transitory computer-readable recording medium and a substrate processing apparatus.

BACKGROUND

As a part of a manufacturing process of a semiconductor device, a process of modifying a film formed on a substrate by a plasma may be performed.

SUMMARY

Described herein is a technique capable of improving characteristics of a film formed on a surface of a substrate.

According to one or more embodiments of the present disclosure, there is provided a technique related to a method of manufacturing a semiconductor device that includes: a method of manufacturing a semiconductor device, including: (a) loading a substrate with a film formed on a surface thereof into a process vessel; (b) generating a reactive species containing oxygen and a reactive species of a rare gas by converting a mixed gas containing the rare gas and an oxygen-containing gas into a plasma state; and (c) oxidizing the film by supplying the reactive species containing oxygen to the substrate together with the reactive species of the rare gas. In (b), a partial pressure ratio $P_N/P_T$, which is a ratio of a partial pressure $P_N$ of the rare gas in the process vessel to a total pressure $P_T$ of the mixed gas in the process vessel, is set to a value of 0.4 or less.

BRIEF DESCRIPTION OF THE DRAWINGS

FIG. 1 is a diagram schematically illustrating a vertical cross-section of a process furnace 202 of a substrate processing apparatus 100 preferably used in one or more embodiments of the present disclosure.

DETAILED DESCRIPTION

Embodiments

Figure 2:
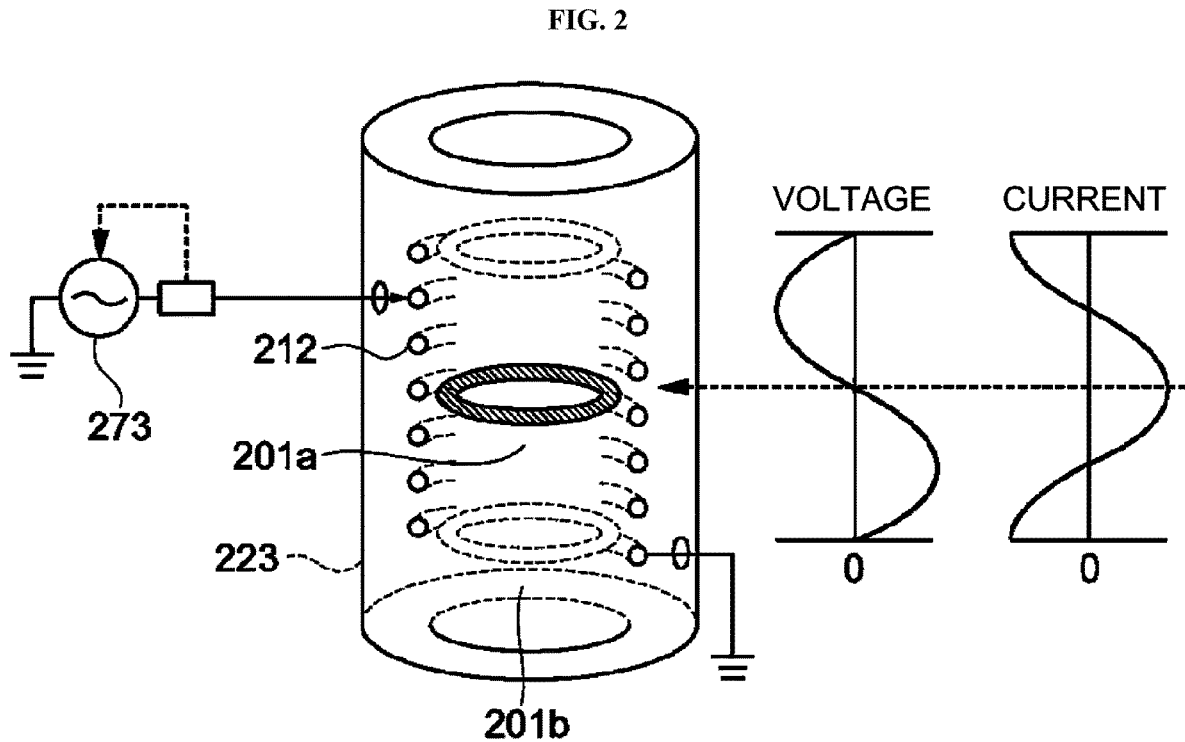
FIG. 2 is a diagram schematically illustrating a principle of generating a plasma according to the embodiments of the present disclosure.

Hereinafter, one or more embodiments (also simply referred to as "embodiments") according to the technique of the present disclosure will be described with reference to FIGS. 1 through 3.

(1) SUBSTRATE PROCESSING APPARATUS

Figure 1:
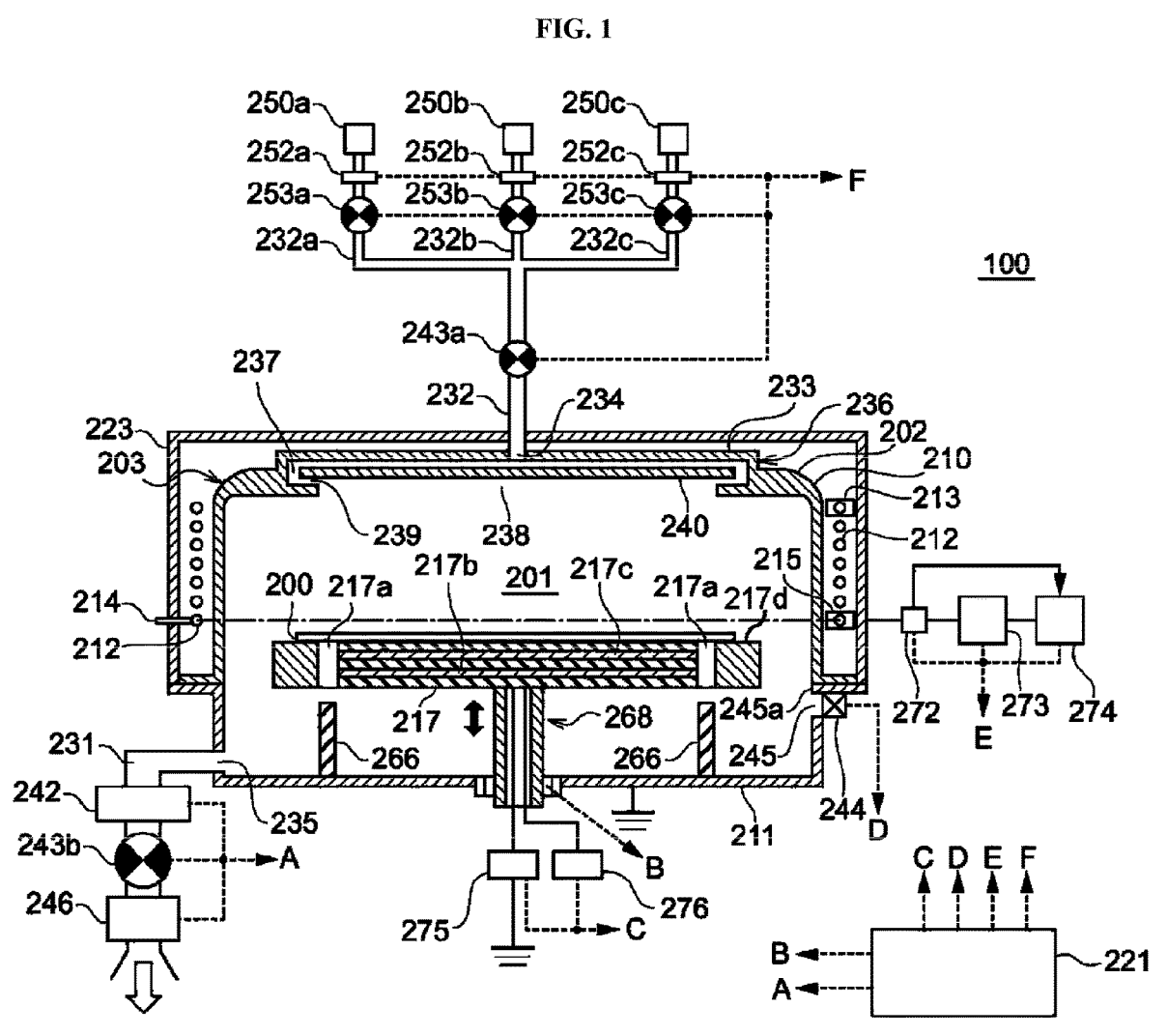

As shown in FIG. 1, a substrate processing apparatus 100 includes a process furnace 202 in which a wafer 200 serving as a substrate is accommodated and a plasma process is performed to the wafer 200. The process furnace 202 includes a process vessel 203. A process chamber 201 is constituted by the process vessel 203. The process vessel 203 includes a dome-shaped upper vessel 210 and a bowl-shaped lower vessel 211. By covering the lower vessel 211 with the upper vessel 210, the process chamber 201 is formed.

A gate valve 244 serving as a valve for a loading/unloading port 245 is provided on a lower side wall of the lower vessel 211. While the gate valve 244 is open, the wafer 200 can be transferred (loaded) into the process chamber 201 through the loading/unloading port 245 or can be transferred (unloaded) out of the process chamber 201 through the loading/unloading port 245. While the gate valve 244 is closed, the gate valve 244 maintains the process chamber 201 airtight.

As shown in FIG. 2, the process chamber 201 includes a plasma generation space 201a and a substrate processing space 201b that communicates with the plasma generation space 201a and in which the wafer 200 is processed. A resonance coil 212 described later is provided around the plasma generation space 201a and around an outer periphery of the process vessel 203. The plasma generation space 201a refers to a space in which the plasma is generated, for example, a space above a lower end (indicated by a dot-and-dash line in FIG. 1) of the resonance coil 212 in the process chamber 201. In addition, the substrate processing space 201b refers to a space in which the wafer 200 is processed by the plasma, for example, a space below the lower end of the resonance coil 212 in the process chamber 201.

A susceptor 217 serving as a substrate support is provided at a center of a bottom portion of the process chamber 201. A substrate placing surface 217d on which the wafer 200 is placed is provided on an upper surface of the susceptor 217. A heater 217b serving as a heating structure is integrally embedded in the susceptor 217. When electric power is supplied to the heater 217b through a heater power regulator 276, the heater 217b is configured to heat the wafer 200 placed on the substrate placing surface 217d such that the wafer 200 is heated to a predetermined temperature ranging, for example, from 25° C. to 1,000° C.

The susceptor 217 is electrically insulated from the lower vessel 211. An impedance adjustment electrode 217c is provided in the susceptor 217. The impedance adjustment electrode 217c is grounded via a variable impedance regulator 275 serving as an impedance adjusting structure. The variable impedance regulator 275 is constituted by components such as a coil (not shown) and a variable capacitor (not shown). The variable impedance regulator 275 is configured to change an impedance of the impedance adjustment electrode 217c within a predetermined range from about 0Ω to a parasitic impedance value of the process chamber 201 by controlling the inductance and resistance of the coil (not shown) and the capacitance value of the variable capacitor (not shown). Thereby, it is possible to control the potential (bias voltage) of the wafer 200 via the impedance adjustment electrode 217c and the susceptor 217 when performing the plasma process.

A susceptor elevator 268 configured to elevate and lower the susceptor 217 is provided below the susceptor 217. Through-holes (for example, three through-holes) 217a are provided at the susceptor 217. Support pins (for example, three support pins) 266 serving as a support structure capable of supporting the wafer 200 are provided at a bottom surface of the lower vessel 211 in a manner corresponding to the through-holes 217a, respectively. When the susceptor 217 is lowered by the susceptor elevator 268, tips (front ends) of the three support pins 266 pass through the three through-holes 217a, respectively, and protrude upward from the substrate placing surface 217d of the susceptor 217. Thereby, the three support pins 266 are capable of supporting the wafer 200 from thereunder.

A gas supply head 236 is provided above the process chamber 201, that is, on an upper portion of the upper vessel 210. The gas supply head 236 includes a cap-shaped lid 233, a gas inlet port 234, a buffer chamber 237, an opening 238, a shield plate 240 and a gas outlet port 239. The gas supply head 236 is configured to supply a gas into the process chamber 201. The buffer chamber 237 functions as a dispersion space in which the gas introduced (supplied) through the gas inlet port 234 is dispersed.

A downstream end of a gas supply pipe 232a through which a rare gas such a helium (He) gas is supplied, a downstream end of a gas supply pipe 232b through which an oxygen (O)-containing gas such as an oxygen (O₂) gas is supplied and a downstream end of a gas supply pipe 232c through which a hydrogen (H)-containing gas such as hydrogen (H₂) gas is supplied are connected to join the gas inlet port 234. A rare gas supply source 250a, a mass flow controller (MFC) 252a serving as a flow rate controller and a valve 253a serving as an opening/closing valve are sequentially provided in this order from an upstream side to a downstream side of the gas supply pipe 232a along a gas flow direction. An oxygen-containing gas supply source 250b, an MFC 252b and a valve 253b are sequentially provided in this order from an upstream side to a downstream side of the gas supply pipe 232b along the gas flow direction. A hydrogen-containing gas supply source 250c, an MFC 252c and a valve 253c are sequentially provided in this order from an upstream side to a downstream side of the gas supply pipe 232c along the gas flow direction. A valve 243a is provided on a downstream side of a location where the gas supply pipe 232a, the gas supply pipe 232b and the gas supply pipe 232c join. It is possible to supply each of the rare gas, the oxygen-containing gas and the hydrogen-containing gas into the process vessel 203 via the gas supply pipes 232a, 232b and 232c by opening and closing the valves 253a, 253b, 253c and 243a while adjusting flow rates of the respective gases by the MFCs 252a, 252b and 252c. In addition to the gases described above, nitrogen (N₂) gas serving as an inert gas can be supplied through the gas supply pipes 232a, 232b and 232c.

A mixed gas containing the rare gas, the oxygen-containing gas and the hydrogen-containing gas is converted into a plasma state and supplied to the wafer 200 in a substrate processing described later, and a film formed on a surface of the wafer 200 is modified (oxidized) by the mixed gas supplied to the wafer 200. The oxygen-containing gas acts as an oxidizing agent in the substrate processing described later. An oxidizing action cannot be obtained by the hydrogen-containing gas alone. However, in the substrate processing described later, by reacting the hydrogen-containing gas with the oxygen-containing gas under specific conditions, a reactive species (an oxidizing species or an active species) such as a hydroxyl radical (OH radical) may be generated. Thus, the hydrogen-containing gas acts to improve an efficiency of an oxidation process. For example, in the substrate processing described later, by suppressing a deactivation of the generated reactive species containing oxygen or by increasing an activity of the generated reactive species containing oxygen, the rare gas acts to promote the oxidizing action by the reactive species containing oxygen and to maintain the oxidizing action. The N₂ gas is used in the substrate processing described later without being converted into a plasma state, and may act as a purge gas.

A first gas supplier (which is a first gas supply system) is constituted mainly by the gas supply head 236 (that is, the lid 233, the gas inlet port 234, the buffer chamber 237, the opening 238, the shield plate 240 and the gas outlet port 239), the gas supply pipe 232a, the MFC 252a and the valves 253a and 243a. The first gas supplier may also be referred to as a rare gas supplier (which is a rare gas supply system). A second gas supplier (which is a second gas supply system) is constituted mainly by the gas supply head 236, the gas supply pipe 232b, the MFC 252b and the valves 253b and 243a. The second gas supplier may also be referred to as an oxygen-containing gas supplier (which is an oxygen-containing gas supply system) or an oxidizing agent supplier (which is an oxidizing agent supply system). A third gas supplier (which is a third gas supply system) is constituted mainly by the gas supply head 236, the gas supply pipe 232c, the MFC 252c and the valves 253c and 243a. The third gas supplier may also be referred to as a hydrogen-containing gas supplier (which is a hydrogen-containing gas supply system). The third gas supplier may be included in the second gas supplier.

A gas exhaust port 235 through which an inner atmosphere of the process chamber 201 is exhausted is provided on a side wall of the lower vessel 211. An upstream end of an exhaust pipe 231 is connected to the gas exhaust port 235. An APC (Automatic Pressure Controller) valve 242 serving as a pressure regulator (pressure adjusting structure), a valve 243b and a vacuum pump 246 serving as a vacuum exhaust apparatus are sequentially provided in this order from an upstream side to a downstream side of the exhaust pipe 231. An exhauster (which is an exhaust system) is constituted mainly by the gas exhaust port 235, the exhaust pipe 231, the APC valve 242 and the valve 243b. The exhauster may further include the vacuum pump 246.

The resonance coil 212 of a helical shape is provided around an outer periphery of the process chamber 201, that is, around an outer portion of a side wall of the upper vessel 210 so as to surround the process vessel 203. An RF (Radio Frequency) sensor 272, a high frequency power supply 273 and a frequency matcher (also referred to as a "matcher" or a "frequency controller") 274 are connected to the resonance coil 212. A shield plate 223 is provided around an outer periphery of the resonance coil 212.

The high frequency power supply 273 is configured to supply a high frequency power to the resonance coil 212. The RF sensor 272 is provided at an output side of the high frequency power supply 273. The RF sensor 272 is configured to monitor information of the traveling wave or reflected wave of the high frequency power supplied from the high frequency power supply 273. The frequency matcher 274 is configured to match (or adjust) a frequency of the high frequency power output from the high frequency power supply 273 so as to minimize the reflected wave based on the information of the reflected wave monitored by the RF sensor 272.

Both ends (that is, a first end and a second end) of the resonance coil 212 are electrically grounded. The first end of the resonance coil 212 is grounded via a movable tap 213. The second end of the resonance coil 212 is grounded via a fixed ground 214. A movable tap 215 capable of appropriately setting a position of receiving the high frequency power from the high frequency power supply 273 is provided between the first end and the second end of the resonance coil 212. According to the configuration described above, when the substrate processing apparatus 100 is newly installed or process conditions of the substrate processing apparatus 100 are changed, it is possible to easily perform operations such as fine-tuning an electrical length or an impedance of the resonance coil 212 and adjusting the resonance characteristics of the resonance coil 212 to be substantially the same as those of the high frequency power supply 273.

The shield plate 223 is provided to shield the leakage of an electromagnetic wave to an outside of the resonance coil 212 and to form a capacitive component of the resonance coil 212 for constructing a resonance circuit.

A plasma generator (which is a plasma generating structure) is constituted mainly by the resonance coil 212, the RF sensor 272 and the frequency matcher 274. The plasma generator may further include the high frequency power supply 273 or the shield plate 223.

Hereinafter, operations of the plasma generator and properties of the generated plasma will be supplementally described with reference to FIG. 2.

The resonance coil 212 is configured to function as a high frequency inductively coupled plasma (ICP) electrode. For example, a winding diameter, a winding pitch and the number of winding turns of the resonance coil 212 are set such that the resonance coil 212 resonates in a full-wavelength mode to form a standing wave of a predetermined wavelength. The electrical length of the resonance coil 212 (that is, an electrode length between the grounds described above) is adjusted to an integral multiple of a wavelength of a predetermined frequency of the high frequency power supplied from the high frequency power supply 273. The resonance characteristics of the resonance coil 212, an electric power supplied to the resonance coil 212, a strength of a magnetic field generated by the resonance coil 212, and the like can be appropriately determined in consideration of, for example, an outer shape of the substrate processing apparatus 100 and process contents. For example, an effective cross-section of the resonance coil 212 is set to a value ranging from 50 mm² to 300 mm², and a diameter of the resonance coil 212 is set to a value ranging from 200 mm to 500 mm. The resonance coil 212 is wound, for example, twice to 60 times. The level of the high frequency power supplied to the resonance coil 212 is set to a value ranging from 0.5 KW to 5 KW, preferably, from 1.0 KW to 4.0 KW, and the frequency of the high frequency power is set to a value ranging from 800 kHz to 50 MHz. The magnetic field generated by the resonance coil 212 is set to a value ranging from 0.01 Gauss to 10 Gauss. According to the present embodiments, as a preferred example, the frequency of the high frequency power is set to 27.12 MHz, and the electrical length of the resonance coil 212 is set equal to the wavelength of the high frequency power (about 11 meters).

The high frequency power supply 273 includes a power supply controller (not shown) and an amplifier (not shown). The power supply controller is configured to output a predetermined high frequency signal (which is a control signal) to the amplifier based on output conditions related to the power or the frequency preset in advance through an operation panel. The amplifier is configured to output the high frequency power obtained by amplifying the control signal received from the power supply controller toward the resonance coil 212 via a transmission line. As described above, the RF sensor 272 is provided at an output side of the amplifier. The RF sensor 272 is configured to detect the power of the reflected wave in the transmission line and to feed back a voltage signal related to the power of the reflected wave to the frequency matcher 274.

The frequency matcher 274 is configured to receive the voltage signal related to the power of the reflected wave from the RF sensor 272, and to perform a corrective control operation such as increasing or decreasing the frequency (oscillation frequency) of the high frequency power output by the high frequency power supply 273 such that power of the reflected wave is minimized. The frequency matcher 274 may include a frequency control circuit (not shown) configured to perform the corrective control operation of the oscillation frequency. The frequency control circuit oscillates at an unloaded resonance frequency of the resonance coil 212 before the plasma is turned on, and oscillates a preset frequency (that is, a frequency increased or decreased from the unloaded resonance frequency) after the plasma is turned on so that the power of the reflected wave is minimized. The frequency control circuit feeds back a control signal including the frequency obtained by performing the corrective control operation to the high frequency power supply 273. The high frequency power supply 273 corrects the frequency of the high frequency power based on the control signal. The frequency of the high frequency power is optimized to a resonance frequency at which the power of the reflected wave in the transmission line becomes zero.

With the configuration of the plasma generator described above, an induction plasma of a good quality with almost no capacitive coupling with components such as an inner wall of the process chamber 201 and the susceptor 217 is excited in the plasma generation space 201a. That is, a donut-shaped plasma when viewed from above and with extremely low electric potential is generated in the plasma generation space 201a. According to the preferred example of the present embodiments in which the electrical length of the resonance coil 212 is set equal to the wavelength of the high frequency power, the donut-shaped plasma is generated in the vicinity of a height corresponding to an electric midpoint of the resonance coil 212.

Figure 3:
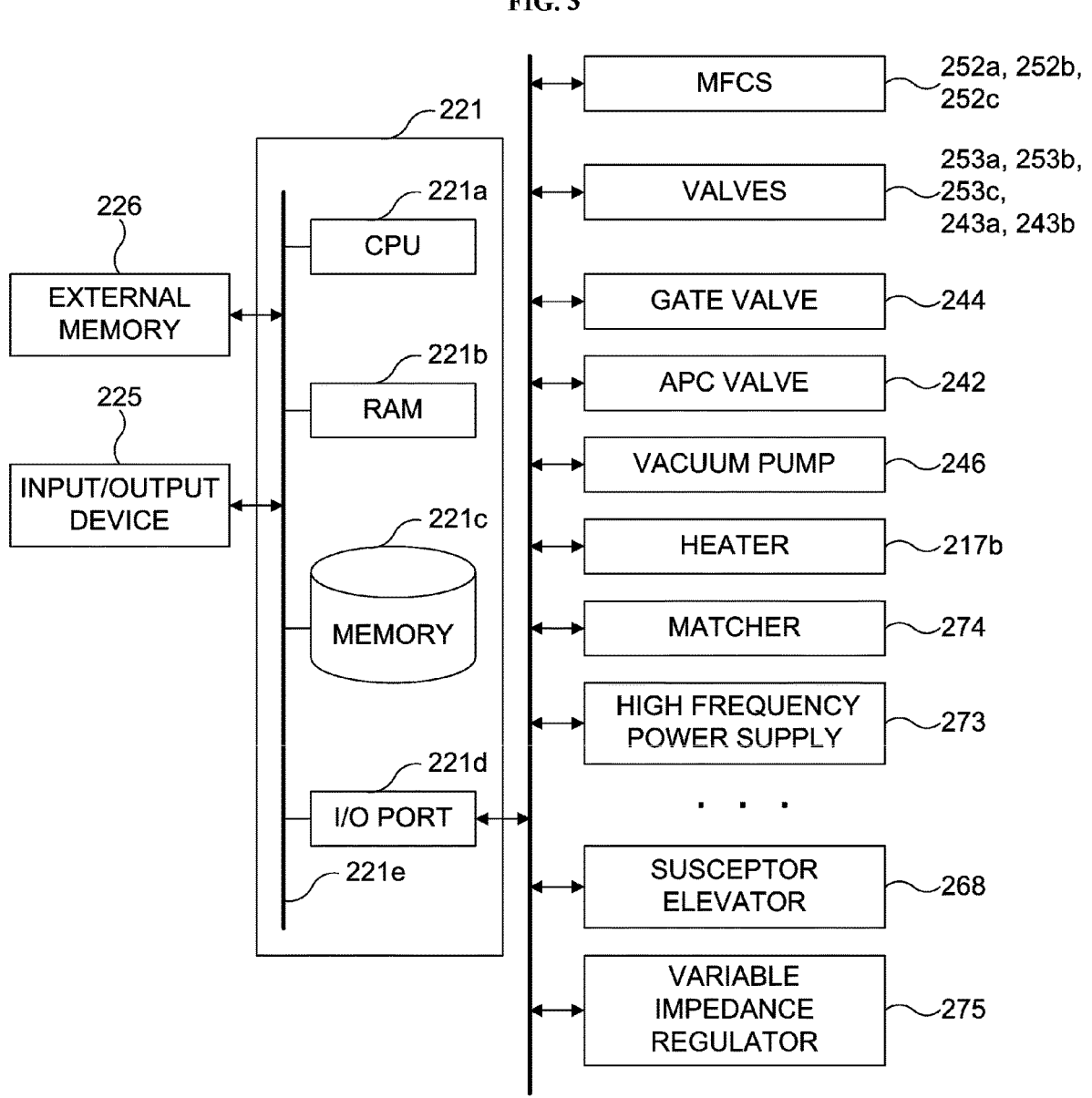
FIG. 3 is a block diagram schematically illustrating a configuration of a controller 221 and related components of the substrate processing apparatus 100 preferably used in the embodiments described herein.

As shown in FIG. 3, a controller 221 serving as a control structure may be constituted by a computer including a CPU (Central Processing Unit) 221a, a RAM (Random Access Memory) 221b, a memory 221c and an I/O port 221d. The RAM 221b, the memory 221c and the I/O port 221d may exchange data with the CPU 221a through an internal bus 221e. For example, an input/output device 225 such as a touch panel, a mouse, a keyboard and an operation terminal may be connected to the controller 221. A display (not shown) serving as a display structure may be connected to the controller 221.

The memory 221*c* may be constituted by a component such as a flash memory, an HDD (Hard Disk Drive) and a CD-ROM. For example, data such as a control program configured to control operations of the substrate processing apparatus 100 and a process recipe in which information such as sequences and conditions of the substrate processing described later is stored may be readably stored in the memory 221*c*. The process recipe is obtained by combining steps of the substrate processing described later such that the controller 221 can execute the steps to acquire a predetermine result, and functions as a program. The RAM 221*b* functions as a memory area (work area) where a program or data read by the CPU 221*a* is temporarily stored.

The I/O port 221*d* is electrically connected to the above-described components such as the MFCs 252*a*, 252*b* and 252*c*, the valves 253*a*, 253*b*, 253*c*, 243*a* and 243*b*, the gate valve 244, the APC valve 242, the vacuum pump 246, the heater 217*b*, the RF sensor 272, the high frequency power supply 273, the frequency matcher 274, the susceptor elevator 268 and the variable impedance regulator 275.

The CPU 221*a* is configured to read and execute the control program stored in the memory 221*c*, and to read the process recipe stored in the memory 221*c* in accordance with an instruction such as an operation command inputted via the input/output device 225. The CPU 221*a* is configured to be capable of controlling the operation of the substrate processing apparatus 100 according to the process recipe. For example, as shown in FIG. 1, the CPU 221*a* may be configured to perform the operations of the substrate processing apparatus 100, according to the read process recipe, such as an operation of adjusting an opening degree of the APC valve 242, an opening and closing operation of the valve 243*b* and a start and stop of the vacuum pump 246 via the I/O port 221*d* and a signal line "A", an elevating and lowering operation of the susceptor elevator 268 via the I/O port 221*d* and a signal line "B", a power supply amount adjusting operation (temperature adjusting operation) to the heater 217*b* by the heater power regulator 276 based on a temperature sensor (not shown) and an impedance adjusting operation by the variable impedance regulator 275 via the I/O port 221*d* and a signal line "C", an opening and closing operation of the gate valve 244 via the I/O port 221*d* and a signal line "D", controlling operations of the RF sensor 272, the frequency matcher 274 and the high frequency power supply 273 via the I/O port 221*d* and a signal line "E", and flow rate adjusting operations for various gases by the MFCs 252*a*, 252*b* and 252*c* and opening and closing operations of the valves 253*a*, 253*b*, 253*c* and 243*a* via the I/O port 221*d* and a signal line "F".

(2) SUBSTRATE PROCESSING

Figure 6:
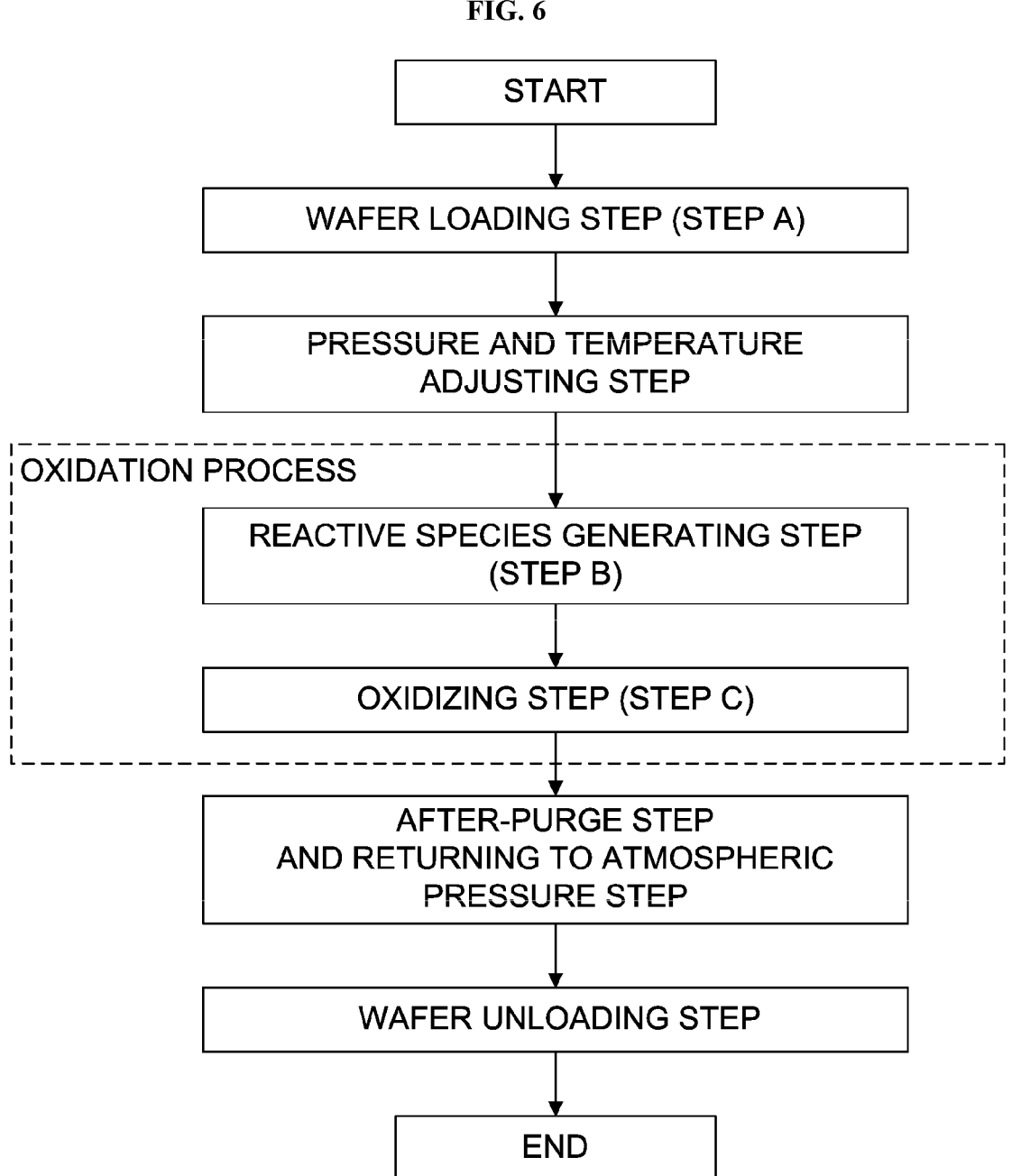
FIG. 6 is a flow chart schematically illustrating a substrate processing according to the embodiments of the present disclosure.

An exemplary sequence of the substrate processing of oxidizing the film formed on the surface of the wafer 200 serving as a substrate, which is a part of a manufacturing process of a semiconductor device, will be described with reference to FIG. 6. The substrate processing is performed by using the substrate processing apparatus 100 described above. In the following description, the operations of the components constituting the substrate processing apparatus 100 are controlled by the controller 221.

The exemplary sequence of the substrate processing according to the present embodiments may include: a step "A" of loading the wafer 200, provided with a silicon oxide film (also simply referred to as an "SiO film") formed on the surface thereof, into the process vessel 203; a step "B" of generating the reactive species containing oxygen and a reactive species of helium (that is, a reactive species of a rare gas element) by converting a mixed gas containing the He gas serving as the rare gas and the $O_2$ gas serving as the oxygen-containing gas into a plasma state; and a step "C" of oxidizing the SiO film by supplying the reactive species containing oxygen described above to the wafer 200 together with the reactive species of helium. In the step B, a ratio of a partial pressure $P_N$ of the rare gas in the process vessel 203 to a total pressure $P_T$ of the mixed gas in the process vessel 203, that is, a partial pressure ratio $P_N/P_T$, is set to be a value of 0.4 or less.

In addition, the exemplary sequence of the substrate processing according to the present embodiments will be described by way of an example in which the $H_2$ gas serving as the hydrogen-containing gas is used in the step B in addition to the $O_2$ gas serving as the oxygen-containing gas.

In the present specification, the term "wafer" may refer to "a wafer itself", or may refer to "a wafer and a stacked structure (aggregated structure) of a predetermined layer (or layers) or film (or films) formed on a surface of the wafer". In the present specification, the term "a surface of a wafer" may refer to "a surface of a wafer itself", or may refer to "a surface of a predetermined layer or film formed on a wafer". Thus, in the present specification, "forming a predetermined layer (or film) on a wafer" may refer to "forming a predetermined layer (or film) on a surface of a wafer itself", or may refer to "forming a predetermined layer (or film) on a surface of another layer (or another film) formed on a wafer". In the present specification, the terms "substrate" and "wafer" may be used as substantially the same meaning. That is, the term "substrate" may be substituted by "wafer" and vice versa.

Wafer Loading Step

With the susceptor 217 lowered to a predetermined transfer position, the gate valve 244 is opened, and the wafer 200 to be processed is transferred (loaded) into the process vessel 203 by a transfer robot (not shown) (step A). A transfer system (not shown) is constituted mainly by the transfer robot. The wafer 200 loaded into the process vessel 203 is horizontally placed and supported on the three support pins 266 protruding upward from the substrate placing surface 217*d* of the susceptor 217. After the wafer 200 is loaded into the process vessel 203 completely, an arm of the transfer robot is retracted from the process vessel 203, and the gate valve 244 is closed. Thereafter, the susceptor 217 is elevated to a predetermined process position such that the wafer 200 to be processed is transferred from the three support pins 266 onto the susceptor 217.

The SiO film, which is a film to be modified (oxidized), is formed in advance on the wafer 200 to be processed. For example, by using a method such as a chemical vapor deposition (CVD) method and an atomic layer deposition (ALD) method, the SiO film may be formed on the wafer 200 by depositing the SiO under a relatively low temperature condition, for example, a temperature condition in a range of room temperature to 600° C., preferably 100° C. to 500° C. Compared with an SiO film formed under a temperature condition higher than the relatively low temperature condition, the SiO film formed under the relatively low temperature condition tends to contain a large amount of impurities and a film density of the SiO film formed under the relatively low temperature condition tends to be low. For example, the impurities may include at least one selected from the group of hydrogen (H), oxygen (O), water ($H_2O$), carbon (C), nitrogen (N), phosphorus (P), sulfur (S), fluorine (F) and chlorine (Cl). The SiO film containing a large amount of the impurities and of a low film density is generally a film of a large wet etching rate (WER) with respect to a substance such as an aqueous solution of hydrogen fluoride (HF), that is, a film of a low wet etching resistance.

Pressure and Temperature Adjusting Step

Subsequently, an inner atmosphere of the process vessel 203 is vacuum-exhausted by the vacuum pump 246 such that an inner pressure of the process vessel 203 reaches and is maintained at a desired process pressure. The inner pressure of the process vessel 203 is measured by a pressure sensor (not shown), and the APC valve 242 is feedback-controlled based on the measured pressure information. In addition, the wafer 200 is heated by the heater 217b such that a temperature of the wafer 200 reaches and is maintained at a desired process temperature. When the inner pressure of the process vessel 203 reaches and is stabilized at the desired process pressure and the temperature of the wafer 200 reaches and is stabilized at the desired process temperature, the oxidation process described later is performed.

Oxidation Process

In the oxidation process (also referred to as a modification process), the mixed gas containing the He gas, the $O_2$ gas and the $H_2$ gas is supplied into the process vessel 203, and the mixed gas is converted into a plasma state. Thereby, the reactive species containing oxygen and the reactive species containing helium are generated (step B). Specifically, the valves 253a through 253c are opened to mix and to supply the He gas, the $O_2$ gas and the $H_2$ gas into the process chamber 201 via the buffer chamber 237 while flow rates of the He gas, the $O_2$ gas and the $H_2$ gas are adjusted by the MFCs 252a through 252c, respectively. When supplying the mixed gas, the high frequency power is applied to the resonance coil 212 from the high frequency power supply 273. As a result, the donut-shaped induction plasma when viewed from above is excited at the height corresponding to the electric midpoint of the resonance coil 212 in the plasma generation space 201a.

The $O_2$ gas and the $H_2$ gas contained in the mixed gas are activated (excited) by plasma-exciting the induction plasma and dissociates. Thereby, the reactive species containing oxygen is generated in the process vessel 203. The reactive species containing oxygen may include at least one among an excited oxygen atom ($O^*$), an ionized oxygen atom and the OH radical. Similarly, the He gas contained in the mixed gas is activated by plasma-exciting the induction plasma and dissociates. Thereby, the reactive species of helium is generated in the process vessel 203. The reactive species of helium may include at least one among an excited helium atom ($He^*$) and an ionized helium atom.

The reactive species containing oxygen generated by performing the step B is supplied to the wafer 200 together with a substance such as the He gas containing the reactive species of helium. As a result, the SiO film formed in advance on the surface of the wafer 200 is modified (oxidized) (step C). Since the energy of the reactive species containing oxygen is very high, the impurities such as hydrogen (H), water ($H_2O$), carbon (C), nitrogen (N), phosphorus (P), sulfur (S), fluorine (F) and chlorine (Cl) contained in the SiO film to be modified are desorbed from the SiO film. Oxygen supplied to the SiO film or oxygen contained in the SiO film is bonded to a dangling bond of silicon in the SiO film generated due to the desorption of the impurities to form a new silicon-oxide (Si—O) bond in the SiO film. Thereby, the SiO film to be modified is modified (changed) into a modified SiO film which contains a lower amount of the impurities and a higher amount of the Si—O bond as compared with those of the SiO film before the modification process. Further, The SiO film to be modified is modified (changed) into the modified SiO film whose purity is high and whose density is high as compared with those of the SiO film before the modification process. The SiO film after the modification process is a film (that is, a film with a high wet etching resistance) with a lower WER with respect to the substance such as the aqueous solution of hydrogen fluoride (HF) than the SiO film before the modification process.

For example, process conditions of the step B and the step C are as follows:

A supply flow rate of the He gas: from 0.01 slm to 5 slm, preferably from 0.1 slm to 1 slm;

A supply flow rate of the $O_2$ gas: from 0.01 slm to 5 slm, preferably from 0.1 slm to 1 slm;

A supply flow rate of the $H_2$ gas: from 0.01 slm to 5 slm, preferably from 0.1 slm to 1 slm; A supply time (time duration) of each gas: from 0.2 minute to 60 minutes, preferably from 0.5 minute to 10 minutes;

The high frequency power: from 100 W to 5,000 W, preferably from 500 W to 3,500 W;

The process temperature: from the room temperature to 1,000° C., preferably from 600° C. to 900° C., more preferably from 700° C. to 800° C.;

The process pressure: from 1 Pa to 250 Pa, more preferably from 30 Pa to 150 Pa; and A distance from the plasma generation space 201a to the surface of the wafer 200: from 10 mm to 200 mm, preferably from 30 mm to 100 mm.

In particular, by setting the process pressure to 30 Pa or more, it is possible to suppress an occurrence of sputtering on an inner wall of the process vessel 203 under the present process conditions. The distance from the plasma generation space 201a to the surface of the wafer 200 described above refers to a distance from a lower end position of the resonance coil 212 to the surface of the wafer 200. In addition, in the present specification, a notation of a numerical range such as "from 10 sccm 5,000 sccm" means a range equal to or higher than 10 sccm and equal to or less than 5,000 sccm. The same also applies to other numerical ranges described herein.

While helium supplied to the wafer 200 together with the reactive species containing oxygen reaches to the surface of the wafer 200 from the plasma generation space 201a (in particular, the height corresponding to the electric midpoint of the resonance coil 212 at which the induction plasma is generated), helium acts to activate the oxygen-containing gas to further generate the reactive species containing oxygen or acts to activate the reactive species containing oxygen to prevent the deactivation of the reactive species containing oxygen. That is, helium supplied to the wafer 200 contributes to maintaining or increasing a density of the reactive species containing oxygen until the reactive species containing oxygen reaches the surface of the wafer 200.

In addition, since helium supplied to the wafer 200 together with the reactive species containing oxygen is an element whose atomic radius is very small, the reactive species of helium penetrates (enters) deeply into the SiO film to be modified such that helium spreads to every corner of the SiO film in an entire thickness direction thereof. The reactive species of helium penetrated into the SiO film acts to prevent the deactivation of the reactive species containing oxygen in the SiO film and to enhance a modification action in the SiO film described above by the reactive species containing oxygen. Therefore, when the reactive species of helium is supplied together with the reactive species containing oxygen, it is possible to effectively assist the oxidation process of the SiO film by the reactive species containing oxygen, and it is also possible to reliably oxidize an entirety of a deeper portion of the SiO film. An action of the oxidation process of the present embodiments affects not only the surface of the SiO film but also, for example, an entirety of the SiO film in the entire thickness direction thereof.

In the present embodiments, the above-described effect of maintaining the density of the reactive species containing oxygen by supplying the reactive species containing oxygen together with helium and the above-described oxidation assist effect (modification assist effect) (hereinafter, both effects are collectively referred to as an "oxidation assist effect") can be obtained by adding a predetermined amount of the He gas to the mixed gas when performing the step B and the step C. That is, the above-described modification effect of reducing the WER of the SiO film can be obtained by setting the ratio of the partial pressure $P_N$ of the He gas in the process vessel 203 to the total pressure $P_T$ of the mixed gas (that is, the He gas, the $O_2$ gas and the $H_2$ gas) in the process vessel 203, that is, the partial pressure ratio $P_N/P_T$, to a predetermined value greater than 0.

Figure 4:
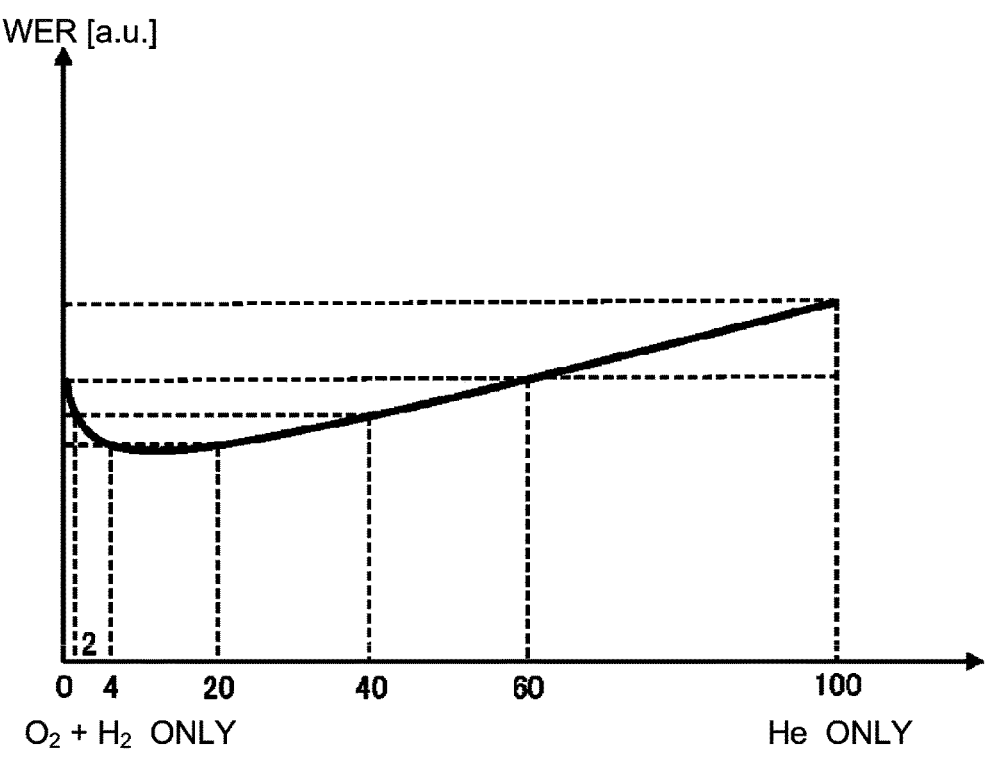
FIG. 4 is a diagram schematically illustrating a relationship between a wet etching resistance of a film after a modification process and a partial pressure ratio $P_N/P_T$ of a rare gas in an oxidation process.

FIG. 4 is a diagram schematically illustrating a relationship between the wet etching resistance of the SiO film after the modification process and the partial pressure ratio $P_N/P_T$ described above in the step B. A vertical axis shown in FIG. 4 represents the WER [a. u.] of the SiO film after the modification process, and a horizontal axis shown in FIG. 4 represents the magnitude of the partial pressure ratio $P_N/P_T$ in the step B in unit of [%]. In FIG. 4, when the $P_N/P_T$ is 0, it indicates that, in the step B, the $O_2$ gas and the $H_2$ gas are supplied into the process vessel 203, and the He gas is not supplied into the process vessel 203 ("$O_2$+$H_2$ ONLY"). In addition, when the $P_N/P_T$ is 100, it indicates that, in the step B, the He gas is supplied into the process vessel 203, and the $O_2$ gas and the $H_2$ gas are not supplied into the process vessel 203 ("He ONLY").

As shown in FIG. 4, by setting the $P_N/P_T$ to a value greater than 0, the above-described oxidation assist effect by supplying the reactive species containing oxygen together with the reactive species of helium can be obtained, and as a result, it is possible to reduce the WER of the SiO film after the modification process, that is, it is possible to increase the wet etching resistance. Specifically, the WER of the SiO film after the modification process obtained by sequentially performing the step B and the step C can be set to a value equal to or smaller than the WER of a SiO film (hereinafter, also referred to as an "SiO film X") obtained by supplying the reactive species containing oxygen alone to the wafer 200 in the process vessel 203 in the step C without supplying the reactive species of helium. In addition, by setting the $P_N/P_T$ to a value of 0.02 [2%] or more, the above-described oxidation assist effect by supplying the reactive species containing oxygen together with the reactive species of helium can be significantly obtained, and it is also possible to reduce the WER of the SiO film after the modification process. In addition, by setting the $P_N/P_T$ to a value of 0.04 [4%] or more, the above-described oxidation assist effect by supplying the reactive species containing oxygen together with the reactive species of helium can be reliably obtained, and it is also possible to reliably reduce the WER of the SiO film after the modification process.

However, as shown in FIG. 4, when the $P_N/P_T$ exceeds 0.6 [60%], it may be difficult to obtain the above-described oxidation assist effect by supplying the reactive species containing oxygen together with the reactive species of helium, that is, the effect of reducing the WER of the SiO film after the modification process. Specifically, the WER of the SiO film after the modification process obtained by sequentially performing the step B and the step C may be greater than the WER of the SiO film X obtained by supplying the reactive species containing oxygen alone to the wafer 200 in the process vessel 203 in the step C without supplying the reactive species of helium. By setting the $P_N/P_T$ to a value of 0.6 [60%] or less, the above-described oxidation assist effect by supplying the reactive species containing oxygen together with the reactive species of helium can be obtained, and as a result, it is possible to set the WER of the SiO film after the modification process equal to or smaller than the WER of the SiO film X. By setting the $P_N/P_T$ to a value of 0.4 [40%] or less, the above-described oxidation assist effect by supplying the reactive species containing oxygen together with the reactive species of helium can be reliably obtained, and as a result, it is possible to reliably reduce the WER of the SiO film after the modification process. By setting the $P_N/P_T$ to a value of 0.2 [20%] or less, the above-described oxidation assist effect by supplying the reactive species containing oxygen together with the reactive species of helium can be more reliably obtained, and as a result, it is possible to more reliably reduce the WER of the SiO film after the modification process.

Therefore, in the step B, it is preferable that the ratio of the partial pressure $P_N$ of the He gas in the process vessel 203 to the total pressure $P_T$ of the mixed gas (that is, the He gas, the $O_2$ gas and the $H_2$ gas) in the process vessel 203, that is, the partial pressure ratio $P_N/P_T$, is set to a value great than 0 and less than 0.6, preferably 0.01 or more and 0.4 or less, and more preferably 0.05 or more and 0.2 or less. In addition, for example, in the step B, the partial pressure ratio $P_N/P_T$ can be adjusted by controlling a ratio of a flow rate of the He gas supplied into the process vessel 203 to a total flow rate of the $O_2$ gas and the $H_2$ gas supplied into the process vessel 203.

Further, in order to obtain the above-described oxidation assist effect by supplying the reactive species containing oxygen together with the reactive species of helium, the distance from the plasma generation space 201a to the surface of the wafer 200 may be set to a distance where at least a part of the reactive species of helium can reach the surface of the wafer 200 without being deactivated. According to the present embodiments, for example, by setting the distance to 10 mm to 200 mm, preferably 30 mm to 100 mm, the reactive species of helium at a flow rate capable of obtaining the above-described oxidation assist effect is supplied to the surface of the wafer 200. In addition, by changing the distance described above, a magnitude of the above-described oxidation assist effect may be adjusted. For example, by increasing the distance described above, the above-described oxidation assist effect may be adjusted to be small.

Instead of the He gas, for example, a gas such as argon (Ar) gas, neon (Ne) gas and xenon (Xe) gas may be used as the rare gas.

Instead of the $O_2$ gas, for example, a gas containing oxygen and free of hydrogen such as ozone ($O_3$) gas, water vapor ($H_2O$ gas), nitric oxide (NO) gas and nitrous oxide ($N_2O$) gas may be used as the oxygen-containing gas.

Instead of the $H_2$ gas, for example, a gas such as deuterium ($D_2$) gas may be used as the hydrogen-containing gas.

After-purge Step and Returning to Atmospheric Pressure Step

After the modification process described above is completed, the supply of the He gas, the supply of the $O_2$ gas and the supply of the $H_2$ gas into the process vessel 203 are stopped, and the supply of the high frequency power to the resonance coil 212 is also stopped. In addition, the $N_2$ gas serving as the purge gas is supplied into the process vessel 203, and is exhausted through the exhaust pipe 231. Thereby, the inner atmosphere of the process vessel 203 is purged to remove a substance in the process vessel 203 such as a residual gas and reaction by-products from the process vessel 203. Thereafter, the inner atmosphere of the process vessel 203 is replaced with the $N_2$ gas, and the inner pressure of the process vessel 203 is returned to the normal pressure (atmospheric pressure).

Wafer Unloading Step

Subsequently, the susceptor 217 is lowered to the predetermined transfer position until the wafer 200 is transferred to the support pins 266 from the susceptor 217. Thereafter, the gate valve 244 is opened, and the processed wafer 200 is unloaded out of the process vessel 203 by using the transfer robot (not shown). Thereby, the substrate processing according to the present embodiments is completed.

(3) EFFECTS ACCORDING TO PRESENT EMBODIMENTS

According to the present embodiments described above, it is possible to provide one or more of the following effects.

(a) By performing the step B and the step C, the above-described impurities contained in the SiO film before the modification process can be removed from the SiO film. In addition, the SiO film after the modification process can be modified into a film containing a higher amount of the Si—O bond and of a higher density as compared with the SiO film before the modification process. As a result, it is possible to improve the characteristics of the SiO film after the modification process, for example, by improving the wet etching resistance of the SiO film after the modification process as compared to the wet etching resistance of the SiO film before the modification process.

(b) The above-described oxidation assist effect by supplying the reactive species containing oxygen together with the reactive species of helium can be obtained by generating the reactive species containing oxygen and the reactive species of helium in the step B and supplying the reactive species containing oxygen to the wafer 200 together with the reactive species of helium in the step C. As a result, it is possible to improve the characteristics of the SiO film after the modification process, for example, by increasing the wet etching resistance of the SiO film after the modification process.

(c) The above-described oxidation assist effect by supplying the reactive species containing oxygen together with the reactive species of helium can be obtained by setting, in the step B, the ratio of the partial pressure $P_N$ of the He gas in the process vessel 203 to the total pressure $P_T$ of the mixed gas (that is, the He gas, the $O_2$ gas and the $H_2$ gas) in the process vessel 203, that is, the partial pressure ratio $P_N/P_T$, to a value great than 0 and less than 0.6. Thereby, it is possible to further enhance the wet etching resistance of the SiO film after the modification process. In addition, by setting the partial pressure ratio $P_N/P_T$ to a value of 0.02 or more and 0.4 or less, the above-described oxidation assist effect can be significantly obtained, and by setting the partial pressure ratio $P_N/P_T$ to a value of 0.04 or more and 0.2 or less, the above-described oxidation assist effect can be reliably obtained.

(d) By adding the $H_2$ gas to the $O_2$ gas in the step B, an effect of improving an oxidizing power can be obtained as compared with a case where the $O_2$ gas alone is supplied as the oxygen-containing gas. Thereby, it is possible to improve the characteristics of the SiO film after the modification process, for example, by increasing the wet etching resistance of the SiO film after the modification process.

(e) By using the He gas whose atomic radius is small and whose possibility of penetrating deeply into the SiO film is extremely high as the rare gas, it is possible to obtain the above-described oxidation assist effect, for example, throughout the entire portion of the SiO film in the entire thickness direction thereof. Thereby, it is possible to improve the characteristics of the SiO film after the modification process, for example, by increasing the wet etching resistance of the SiO film after the modification process.

(f) The same effects described above may be obtained similarly when a gas other than the He gas is used as the rare gas, when a gas other than the $O_2$ gas is used as the oxygen-containing gas or when a gas other than the $H_2$ gas is used as the hydrogen-containing gas. However, it is preferable to use the He gas (whose atomic radius is small) as the rare gas because thereby it is possible to more reliably obtain the effects described above as compared with a case where the gas other than the He gas is used as the rare gas. When the gas other than the He gas is used as the rare gas, it is preferable to use a combination of the He gas and the gas other than the He gas. That is, it is preferable that the rare gas contains at least the He gas.

(4) MODIFIED EXAMPLES

The sequence of the substrate processing according to the present embodiments is not limited to the example described above. That is, the sequence of the substrate processing may be modified as shown in the following modified examples. These modified examples may be appropriately combined. In addition, unless otherwise described, process sequences and process conditions of each step of each modified example may be substantially the same as those of each step of the above-described sequence of the substrate processing.

First Modified Example

The technique of the present disclosure is not limited to an example in which the $H_2$ gas is added to the $O_2$ gas in the step B and the step C, and a gas such as the $O_2$ gas may be used alone as the oxygen-containing gas. Even in such a case, the same effects of the sequence of the substrate processing according to the present embodiments described above may be obtained similarly. However, it is preferable to add the $H_2$ gas to the $O_2$ gas serving as the oxygen-containing gas in that the effect of improving the oxidizing power can be obtained.

Second Modified Example

The film to be modified (which is formed on the wafer 200 in advance) is not limited to the SiO film, and another film containing silicon or another film containing an element other than silicon may be used as the film to be modified. For example, a film containing silicon (Si) and nitrogen (N), that is, a silicon nitride film (SiN film) or a film containing silicon (Si), oxygen (O) and nitrogen (N), that is, a silicon oxynitride film (SiON film) may be used as the film to be modified. In addition, a silicon film made of silicon alone may be used as the film to be modified. Even in such cases, the same effects of the sequence of the substrate processing according to the embodiments described above may be obtained similarly.

Other Embodiments

The technique of the present disclosure is described in detail by way of the embodiments described above. However, the technique of the present disclosure is not limited thereto. The technique of the present disclosure may be modified in various ways without departing from the scope thereof.

For example, while the embodiments described above are described by way of an example in which the film to be modified is directly formed on the substrate, that is, an example in which a base of the film to be modified is the surface of the substrate (an example in which a silicon single crystal is used), the technique of the present disclosure is not limited thereto. For example, the base of the film to be modified may be another film formed on the substrate. As another film formed on the substrate, a film such as a silicon film (Si film), a silicon oxide film (SiO film), a silicon nitride film (SiN film) and a silicon oxynitride film (SiON film) may be used. Even in such cases, the same effects of the sequence of the substrate processing according to the embodiments described above may be obtained similarly.

For example, while the embodiments described above are described by way of an example in which the mixed gas of the rare gas and the oxygen-containing gas is converted into a plasma state in the process vessel, the technique of the present disclosure is not limited thereto. That is, the mixed gas may be converted into a plasma state outside the process vessel, and the reactive species containing oxygen generated outside the process vessel may be supplied together with the rare gas into the process vessel. However, in order to sufficiently obtain the above-described oxidation assist effect, it is preferable to use the above-described embodiments.

The above-described embodiments and the modified examples may be appropriately combined. In addition, process sequences and process conditions of each step of each combination thereof may be substantially the same as those of each step of the above-described embodiments.

Example of Embodiments

As a sample #1, by using the substrate processing apparatus 100 shown in FIG. 1, the SiO film formed on the surface of the wafer 200 is oxidized by the sequence of the substrate processing according to the embodiments described above. In the step B, the supply flow rates of the He gas, the $O_2$ gas and the $H_2$ gas into the process vessel 203 are set to 1 slm, 0.75 slm and 0.75 slm in this order, respectively, and the above-described partial pressure ratio $P_N/P_T$ is set to 0.4. The other process conditions are set to be predetermined conditions within the range of the process conditions according to the embodiments described above.

As a sample #2, by using the substrate processing apparatus 100 shown in FIG. 1, the SiO film formed on the surface of the wafer 200 is oxidized by the sequence of the substrate processing according to the embodiments described above. In the step B, the supply flow rates of the He gas, the $O_2$ gas and the $H_2$ gas into the process vessel 203 are set to 0.5 slm, 1 slm and 1 slm in this order, respectively, and the above-described partial pressure ratio $P_N/P_T$ is set to 0.2. The other process conditions are set to be predetermined conditions within the range of the process conditions according to the embodiments described above, which are the same as those of the sample #1.

As a sample #3, by using the substrate processing apparatus 100 shown in FIG. 1, the SiO film formed on the surface of the wafer 200 is oxidized by the sequence of the substrate processing according to the embodiments described above. When preparing the sample #3, the He gas is not supplied into the process vessel 203, and the supply flow rates of the $O_2$ gas and the $H_2$ gas into the process vessel 203 are set to 1.25 slm and 1.25 slm, respectively, and the above-described partial pressure ratio $P_N/P_T$ is set to 0. The other process conditions are set to be predetermined conditions within the range of the process conditions according to the embodiments described above, which are the same as those of the sample #1.

Figure 5:
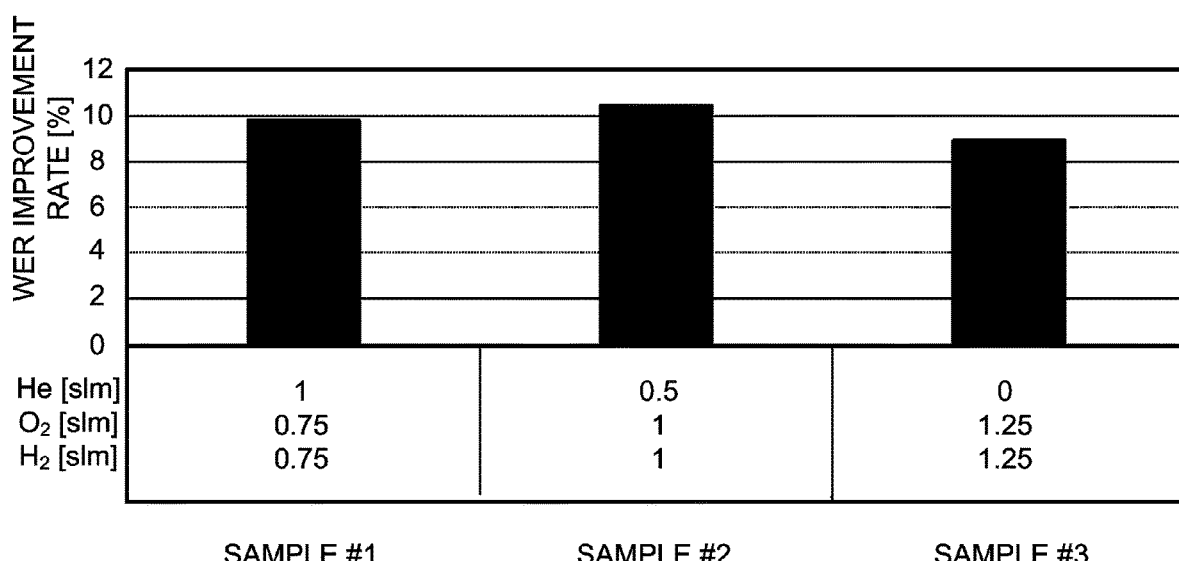
FIG. 5 is a diagram schematically illustrating measurement results of the wet etching resistance of the film after the modification process.

Then, the wet etching resistance of the SiO film after the oxidation process is evaluated. Three bars in a graph shown in an upper region of FIG. 5 represent, from left to right, the sample #1 through the sample #3, respectively. A vertical axis of the graph shown in the upper region of FIG. 5 represents a WER improvement rate [%]. The WER improvement rate refers to an index defined by "(R0–R1)/ R0" when the WER of the SiO film before the modification process with respect to a 1% HF aqueous solution is R0 and the WER of the SiO film after the modification process is R1. The higher the WER improvement rate, the greater a film quality improving effect (wet etching resistance improving effect) can be achieved by the oxidation process.

As shown in FIG. 5, it is confirmed that the WER improvement rate is large and the wet etching resistance is high in each of the sample #1 and the sample #2 in which the partial pressure ratio $P_N/P_T$ is set to 0.4 or less as compared with the sample #3 in which the partial pressure ratio $P_N/P_T$ is set to 0. In addition, it is confirmed that the WER improvement rate is large and the wet etching resistance is high in the sample #2 in which the partial pressure ratio $P_N/P_T$ is set to 0.2 as compared with the sample #1 in which the partial pressure ratio $P_N/P_T$ is set to 0.4. That is, it is confirmed that, by setting the partial pressure ratio $P_N/P_T$ to the value of 0.01 or more and 0.4 or less, the above-described oxidation assist effect can be obtained, and by setting the partial pressure ratio $P_N/P_T$ to the value of 0.2 or less, the above-described oxidation assist effect can be significantly obtained. In addition, it is confirmed that, by setting the partial pressure ratio $P_N/P_T$ to the value of 0.2 or more and 0.4 or less, the above-described oxidation assist effect can be more reliably obtained.

According to some embodiments of the present disclosure, it is possible to improve the characteristics of the film formed on the substrate.

What is claimed is:

1. A method of processing a substrate, comprising:
   (a) loading the substrate with a film formed on a surface thereof into a process vessel;
   (b) generating a reactive species containing oxygen and a reactive species of helium by converting a mixed gas containing a helium gas and an oxygen-containing gas into a plasma state; and
   (c) oxidizing the film by supplying the reactive species containing oxygen to the substrate together with the reactive species of helium such that the reactive species of helium penetrates into the film,
   wherein, in (b), a partial pressure ratio $P_N/P_T$, which is a ratio of a partial pressure $P_N$ of the helium gas in the process vessel to a total pressure $P_T$ of the mixed gas in the process vessel, is set to a value of 0.04 or more and 0.2 or less, and wherein a distance from a plasma generation space where the reactive species containing oxygen and the reactive species of helium are generated in (b) to the substrate is set to a distance where at least a part of the reactive species of helium reaches a surface of the film without being deactivated.

2. The method of claim 1, wherein, in (b), the partial pressure ratio $P_N/P_T$ is selected within a range at which a first wet etching rate of the film after being oxidized by sequentially performing (b) and (c) is equal to or less than a second wet etching rate of the film oxidized by supplying, in (b), the reactive species containing oxygen to the substrate in the process vessel without supplying the reactive species of helium thereto, wherein the first wet etching rate and the second wet etching rate are wet etching rates with respect to an aqueous solution of hydrogen fluoride.

3. The method of claim 1, wherein, in (b), a hydrogen-containing gas is added to the oxygen-containing gas.

4. The method of claim 3, wherein at least one selected from the group consisting of oxygen gas and ozone gas is used as the oxygen-containing gas, and at least one selected from the group consisting of hydrogen gas and deuterium gas is used as the hydrogen-containing gas.

5. The method of claim 1, wherein, in (b), a gas free of hydrogen is used as the oxygen-containing gas.

6. The method of claim 1, wherein the film formed on the surface of the substrate contains silicon.

7. The method of claim 6, wherein the film formed on the surface of the substrate contains silicon oxide.

8. The method of claim 6, wherein the film formed on the surface of the substrate contains silicon nitride.

9. The method of claim 1, wherein the film formed on the surface of the substrate contains one or more impurities selected from the group consisting of hydrogen, oxygen, water, carbon, nitrogen, phosphorus, sulfur, fluorine and chlorine.

10. The method of claim 1, wherein, in (b), a value of the partial pressure ratio $P_N/P_T$ is adjusted by controlling a ratio of a flow rate of the helium gas supplied into the process vessel to a flow rate of the oxygen-containing gas supplied into the process vessel.

11. The method of claim 1, wherein, in (b) and (c), a temperature of the substrate is 700° C. or higher.

12. A method of manufacturing a semiconductor device, comprising the method of claim 1.

13. The method of claim 1, wherein, in (c), the reactive species of helium penetrating into the film prevents deactivation of the reactive species containing oxygen in the film.

14. The method of claim 13, wherein, in (c), the reactive species of helium further generates the reactive species containing oxygen until the reactive species containing oxygen reaches the surface of the film.

15. The method of claim 13, wherein the reactive species of helium spreads to every corner of the film in an entire thickness direction of the film.

16. The method of claim 13, wherein a magnitude of effect of preventing the deactivation of the reactive species containing oxygen in the film by the reactive species of helium is adjusted by changing the distance from the plasma generation space to the substrate.

17. The method of claim 1, wherein the distance from the plasma generation space to the substrate is set to 10 mm to 200 mm.

18. The method of claim 1, wherein the distance from the plasma generation space to the substrate is set to 30 mm to 100 mm.

19. The method of claim 1, wherein, in (c), the reactive species of helium increases a density of the reactive species containing oxygen until the reactive species containing oxygen reaches the surface of the film.

20. The method of claim 1, wherein the mixed gas contains an oxygen gas as the oxygen-containing gas and further contains a hydrogen gas, and wherein, in (b), a flow rate of the helium gas contained in the mixed gas is smaller than both of a flow rate of the oxygen gas contained in the mixed gas and a flow rate of the hydrogen gas contained in the mixed gas.

21. The method of claim 1, wherein the mixed gas contains an oxygen gas as the oxygen-containing gas and further contains a hydrogen gas, and wherein, in (b), a flow rate of the oxygen gas contained in the mixed gas and a flow rate of the hydrogen gas contained in the mixed gas are the same.

22. A method of processing a substrate, comprising:

(a) loading the substrate with a film formed on a surface thereof into a process vessel;

(b) generating a reactive species containing oxygen and a reactive species of helium by converting a mixed gas containing a helium gas and an oxygen-containing gas into a plasma state; and (c) oxidizing the film by supplying the reactive species containing oxygen to the substrate together with the reactive species of helium such that the reactive species of helium penetrates into the film, wherein, in (b), a partial pressure ratio $P_N/P_T$, which is a ratio of a partial pressure $P_N$ of the helium gas in the process vessel to a total pressure $P_T$ of the mixed gas in the process vessel, is set to a value of 0.04 or more and 0.2 or less and is selected within a range at which a first wet etching rate of the film after being oxidized by sequentially performing (b) and (c) is equal to or less than a second wet etching rate of the film oxidized by supplying, in (b), the reactive species containing oxygen to the substrate in the process vessel without supplying the reactive species of helium thereto, wherein the first wet etching rate and the second wet etching rate are wet etching rates with respect to an aqueous solution of hydrogen fluoride, and wherein a distance from a plasma generation space where the reactive species containing oxygen and the reactive species of helium are generated in (b) to the substrate is set to a distance where at least a part of the reactive species of helium reaches a surface of the film without being deactivated.

23. A non-transitory computer-readable recording medium storing a program that causes, by a computer, a substrate processing apparatus to perform:

(a) loading a substrate with a film formed on a surface thereof into a process vessel;

(b) generating a reactive species containing oxygen and a reactive species of helium by converting a mixed gas containing a helium gas and an oxygen-containing gas into a plasma state; and (c) oxidizing the film by supplying the reactive species containing oxygen to the substrate together with the reactive species of helium such that the reactive species of helium penetrates into the film, wherein, in (b), a partial pressure ratio $P_N/P_T$, which is a ratio of a partial pressure $P_N$ of the helium gas in the process vessel to a total pressure $P_T$ of the mixed gas in the process vessel, is set to a value of 0.04 or more and 0.2 or less, and wherein a distance from a plasma generation space where the reactive species containing oxygen and the reactive species of helium are generated in (b) to the substrate is set to a distance where at least a part of the reactive species of helium reaches a surface of the film without being deactivated.

* * * * *